(12) United States Patent
Shen

(10) Patent No.: US 10,340,186 B2
(45) Date of Patent: Jul. 2, 2019

(54) METHOD FOR REDUCING CROSS CONTAMINATION IN INTEGRATED CIRCUIT MANUFACTURING

(71) Applicant: SKYWORKS SOLUTIONS, INC., Woburn, MA (US)

(72) Inventor: Hong Shen, Palo Alto, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 259 days.

(21) Appl. No.: 14/808,250

(22) Filed: Jul. 24, 2015

(65) Prior Publication Data

US 2016/0020146 A1 Jan. 21, 2016

Related U.S. Application Data

(62) Division of application No. 13/466,792, filed on May 8, 2012, now Pat. No. 9,093,506.

(51) Int. Cl.
*H01L 21/768* (2006.01)
*H01L 21/78* (2006.01)
(Continued)

(52) U.S. Cl.
CPC .... *H01L 21/76898* (2013.01); *H01L 21/6835* (2013.01); *H01L 23/4827* (2013.01); *H01L 23/49513* (2013.01); *H01L 24/97* (2013.01); *H01L 21/561* (2013.01); *H01L 21/6836* (2013.01); *H01L 2221/6834* (2013.01); *H01L 2221/68327* (2013.01); *H01L 2221/68331* (2013.01); *H01L 2224/48091* (2013.01);
(Continued)

(58) Field of Classification Search
CPC ............ H01L 21/6835; H01L 21/6836; H01L 21/561; H01L 21/76898; H01L 2221/68327; H01L 2221/68331; H01L 23/4827; H01L 23/49513; H01L 24/97; H01L 2221/6834; H01L 23/544
See application file for complete search history.

(56) References Cited

U.S. PATENT DOCUMENTS 3,673,064 A * 6/1972 Blakeslee ............... H01L 21/00
134/1.3
3,896,479 A 7/1975 DiLorenzo et al.
(Continued)

OTHER PUBLICATIONS

Cacouris, Ted; "Preventing Cross-Contamination Caused by Copper Diffusion", Yield Management Solutions, Autumn 1999, pp. C13-C17.*
(Continued)

*Primary Examiner* — Mary A Wilczewski
(74) *Attorney, Agent, or Firm* — Knobbe Martens Olson and Bear, LLP

(57) ABSTRACT

Systems, apparatuses, and methods related to the design, fabrication, and manufacture of gallium arsenide (GaAs) integrated circuits are disclosed. Copper can be used as the contact material for a GaAs integrated circuit. Metallization of the wafer and through-wafer vias can be achieved through copper plating processes disclosed herein. Various protocols can be employed during processing to avoid cross-contamination between copper-plated and non-copper-plated wafers. GaAs integrated circuits can be singulated, packaged, and incorporated into various electronic devices.

20 Claims, 15 Drawing Sheets

(51) Int. Cl.
  *H01L 23/544* (2006.01)
  *H01L 23/532* (2006.01)
  *H01L 23/495* (2006.01)
  *H01L 23/482* (2006.01)
  *H01L 21/683* (2006.01)
  *H01L 23/00* (2006.01)
  *H01L 21/56* (2006.01)

(52) U.S. Cl.
  CPC .......... *H01L 2224/48227* (2013.01); *H01L 2224/92247* (2013.01); *H01L 2924/01029* (2013.01); *H01L 2924/10253* (2013.01); *H01L 2924/10329* (2013.01); *H01L 2924/12042* (2013.01); *H01L 2924/1305* (2013.01); *H01L 2924/1306* (2013.01); *H01L 2924/15311* (2013.01); *H01L 2924/181* (2013.01)

(56) References Cited

U.S. PATENT DOCUMENTS

| | | | |
|---|---|---|---|
| 5,075,744 A | 12/1991 | Tsui | |
| 6,409,837 B1* | 6/2002 | Hillman | C23C 16/4486 118/712 |
| 6,431,432 B1 | 8/2002 | McCormick et al. | |
| 6,492,269 B1 | 12/2002 | Liu et al. | |
| 6,495,019 B1 | 12/2002 | Filas et al. | |
| 6,596,635 B1 | 7/2003 | Tiku et al. | |
| 6,870,243 B2 | 3/2005 | Elliott et al. | |
| 6,982,441 B2 | 1/2006 | Yamaki et al. | |
| 7,179,738 B2 | 2/2007 | Abbott | |
| 7,402,515 B2 | 7/2008 | Arana et al. | |
| 7,429,529 B2 | 9/2008 | Farnworth et al. | |
| 7,494,925 B2 | 2/2009 | Hiatt | |
| 7,517,798 B2 | 4/2009 | Tuttle | |
| 7,880,307 B2 | 2/2011 | Farnworth et al. | |
| 7,898,064 B2 | 3/2011 | Tuttle | |
| 7,923,842 B2 | 4/2011 | Shen et al. | |
| 8,169,004 B2 | 5/2012 | Kohiro et al. | |
| 8,318,519 B2 | 11/2012 | Doan et al. | |
| 8,415,805 B2* | 4/2013 | Shen | H01L 21/3081 257/774 |
| 8,497,206 B2* | 7/2013 | Hua | H01L 21/76849 257/502 |
| 8,900,969 B2* | 12/2014 | Shen | H01L 21/76898 257/178 |
| 9,093,506 B2* | 7/2015 | Shen | H01L 23/4827 |
| 9,231,068 B2* | 1/2016 | Shen | H01L 21/76898 |
| 9,530,719 B2* | 12/2016 | Shen | H01L 24/83 |
| 9,666,508 B2* | 5/2017 | Shen | H01L 23/481 |
| 9,673,186 B2* | 6/2017 | Takatani | H01L 25/50 |
| 2002/0048889 A1 | 4/2002 | Hayama et al. | |
| 2002/0090746 A1* | 7/2002 | Xu | G01N 27/002 438/17 |
| 2002/0093101 A1 | 7/2002 | Iyer et al. | |
| 2003/0015721 A1 | 1/2003 | Slater et al. | |
| 2003/0020174 A1 | 1/2003 | Kohno | |
| 2003/0141593 A1 | 7/2003 | Zuniga-Ortiz et al. | |
| 2004/0084059 A1* | 5/2004 | Xia | B08B 3/08 134/1.3 |
| 2004/0176053 A1 | 9/2004 | Yamashita | |
| 2005/0085084 A1 | 4/2005 | Chang et al. | |
| 2005/0127480 A1 | 6/2005 | Elliot et al. | |
| 2005/0157476 A1 | 7/2005 | Goudarzi | |
| 2007/0066054 A1 | 3/2007 | Uzoh et al. | |
| 2007/0210340 A1 | 9/2007 | Zampardi | |
| 2010/0297844 A1* | 11/2010 | Yelehanka | H01L 21/76898 438/667 |
| 2011/0095436 A1 | 4/2011 | Chen et al. | |
| 2011/0117739 A1 | 5/2011 | Tuttle | |
| 2011/0217841 A1 | 9/2011 | Chen et al. | |
| 2012/0205916 A1 | 8/2012 | Vuong | |
| 2012/0258594 A1 | 10/2012 | Barth et al. | |
| 2012/0295437 A1 | 11/2012 | Lu et al. | |
| 2013/0299985 A1* | 11/2013 | Shen | H01L 21/76898 257/741 |
| 2014/0209926 A1* | 7/2014 | Takatani | H01L 23/5228 257/77 |
| 2015/0206870 A1* | 7/2015 | Takatani | H01L 25/50 438/107 |
| 2015/0243534 A1* | 8/2015 | Osenbach | H01L 24/83 438/113 |
| 2016/0020146 A1* | 1/2016 | Shen | H01L 21/76898 438/667 |
| 2017/0084592 A1* | 3/2017 | Takatani | H01L 21/02118 |

OTHER PUBLICATIONS

Taylor et al., Preventing Cu Contamination from BEOL Processing, https://www.cemag.us/article/2002/02/preventing-cu-contamination-beol-processing, Feb. 28, 2002, pp. 1-14.*

Nishizawa, et al,; Stress Suppression of Backside Metal in GaAs Devices; CS Mantech Conference Proceedings; p. 271; May 17-20, 2010; Portland, Oregon, USA.

* cited by examiner

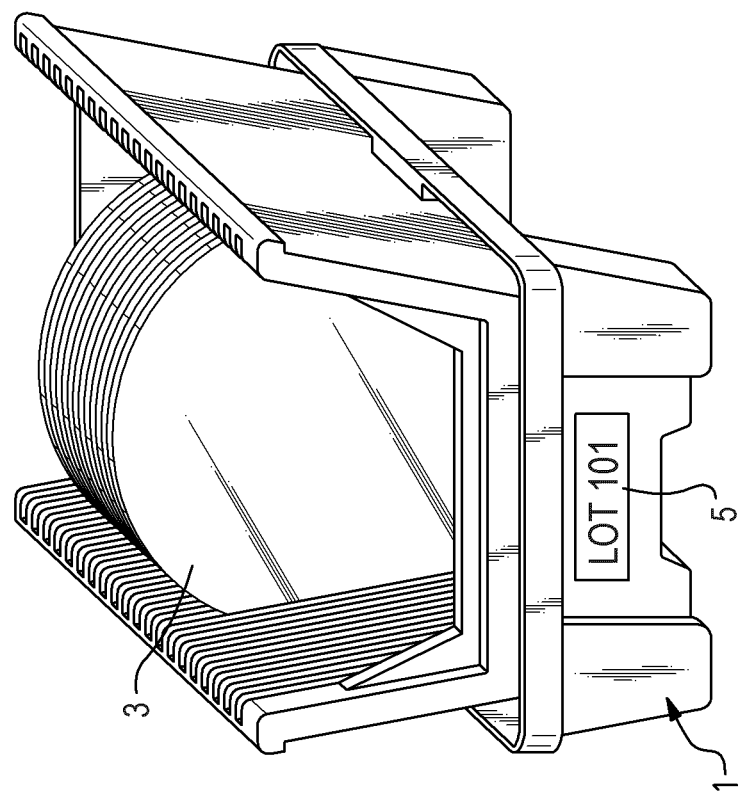

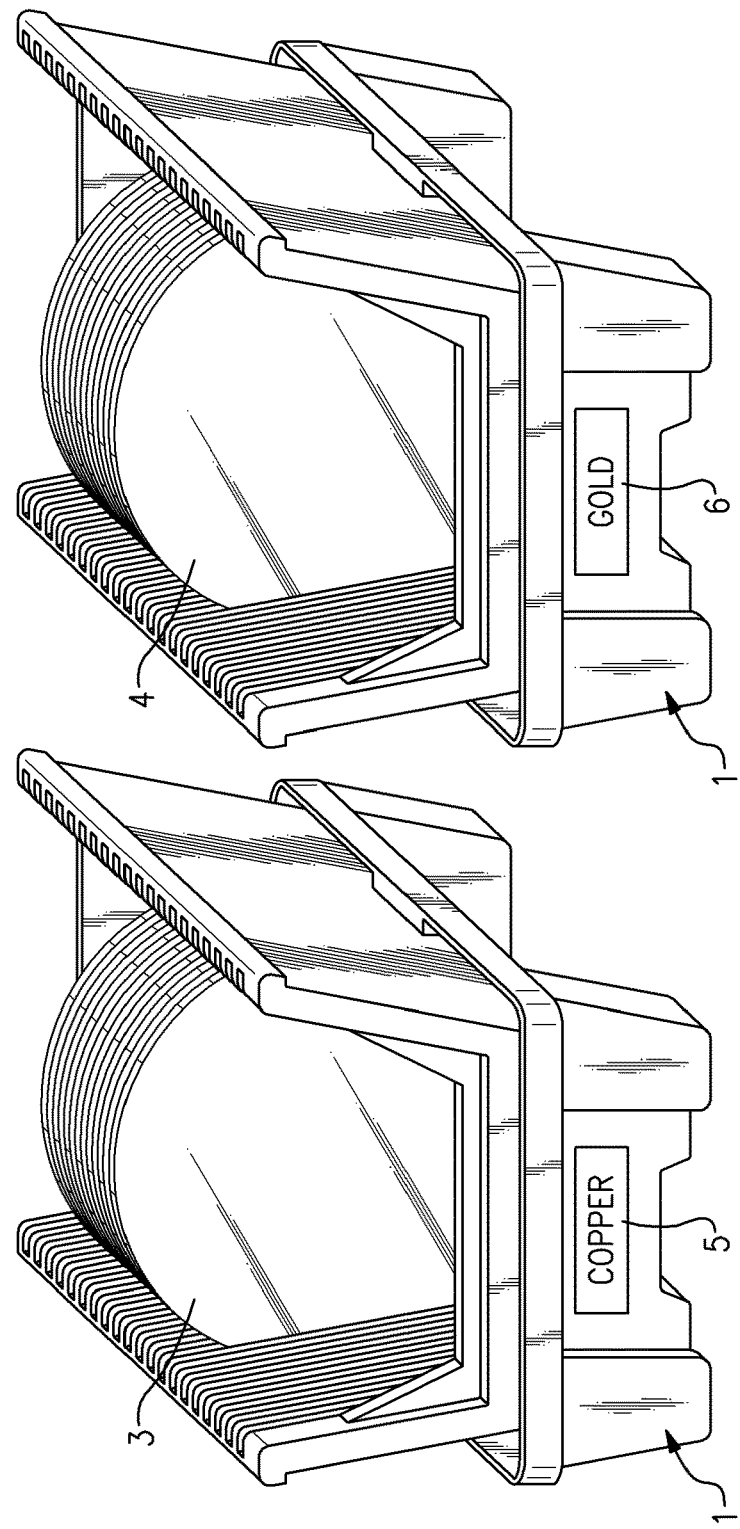

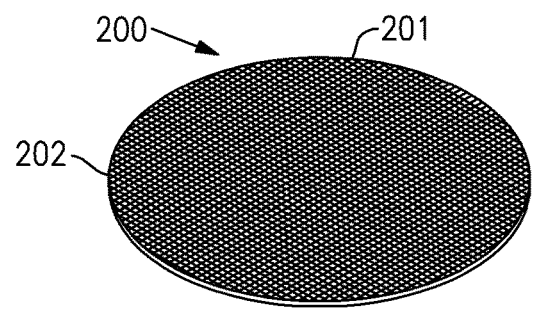
FIG.9A
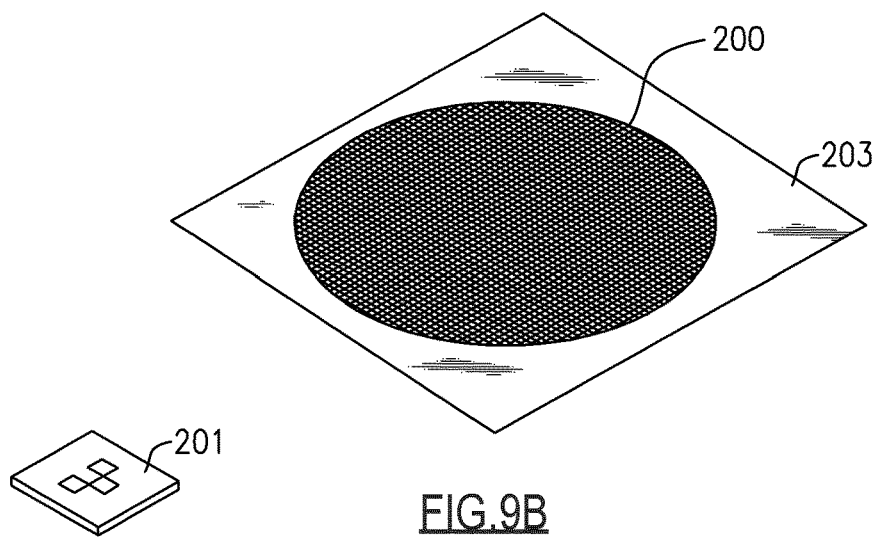
FIG.9B
FIG.9D
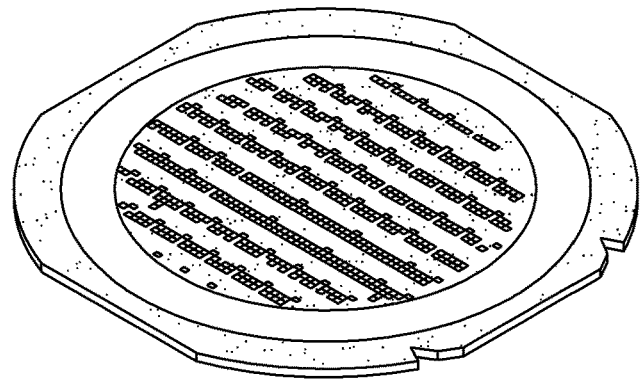
FIG.9C

METHOD FOR REDUCING CROSS CONTAMINATION IN INTEGRATED CIRCUIT MANUFACTURING

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present disclosure generally relates to the field of semiconductor wafer processing technology. In particular, this disclosure relates to the design, fabrication, and manufacture of gallium arsenide (GaAs) integrated circuits.

Description of the Related Art

The use of GaAs substrates in the design and construction of integrated circuits has proven to have desirable effects. For example, GaAs substrates have been useful in achieving greater performance in power amplifier circuits. Typically, a GaAs integrated circuit will be used as a component in a larger circuit device or design. In order to be integrated into the circuit design, the GaAs integrated circuit is mechanically and electrically coupled to a printed circuit board for the circuit device. In other cases, the GaAs integrated device is mounted to other electronic devices.

The contact side of the GaAs integrated circuit is typically adhered to a contact pad on the device's printed circuit board. More particularly, the integrated circuit usually includes a gold layer which adheres to the printed circuit board pad using a conductive adhesive. Often, the GaAs substrate has vias which extend into or through the substrate for facilitating electrical flow vertically through the substrate. These vias are also coated with the gold conductive material. Depositing the gold layer is a time-consuming and relatively inefficient process. Also, gold is an expensive material, increasing the cost for GaAs integrated circuit products. Finally, gold has a relatively high dissolution rate in solder, and therefore is not able to be soldered to the pad of the device's printed circuit board. Instead, conductive adhesive is typically used to adhere the gold contact to the printed circuit board. The use of conductive adhesive requires an additional manufacturing step, and also requires the use of larger pads to accommodate adhesive overflow. However, even with these undesirable features, gold continues to be the standard metal used for a contact layer on GaAs integrated circuits, which significantly drives up the product cost especially in recent years due to the high price of gold.

Accordingly, there is a need for improved GaAs integrated circuits that are employ less costly component materials more efficiently manufactured. Furthermore, there is a need for improved methods for manufacturing such GaAs integrated circuits. As described herein, the inventors have developed systems and methods for fabricating GaAs integrated circuits using copper as the material for the contact layer. Nonetheless, as many devices continue to use gold as the contact material, there is often a need for use of shared equipment between copper-designated GaAs integrated circuits and gold-designated GaAs integrated circuits. Due to the deleterious effects attributable to cross-contamination between the two different contact materials, there is a need for improved systems and methods for processing GaAs integrated circuits having various contact materials. In particular, there is a need for improved methods to prevent cross-contamination between gold-designated GaAs integrated circuits and copper-designated GaAs integrated circuits throughout processing.

SUMMARY OF THE INVENTION

Systems and methods for integrating the fabrication process of copper backside GaAs integrated circuits into fabricating processes for traditional GaAs integrated circuits with gold contact are disclosed herein. The systems and methods of numerous embodiments are designed for efficient use of shared equipment and tooling while reducing cross-contamination, copper oxidation, and other undesirable effects. In one embodiment, a method of utilizing a single GaAs integrated circuit manufacturing process line to produce integrated circuits with alternate backside conductive material includes identifying one or more steps in the manufacturing process which may cause cross contamination between processing integrated circuit products with a first backside material, such as gold, and alternately with a second backside material, such as copper. The method further includes implementing one or more protocols adapted to reduce cross-contamination for the identified steps.

In some embodiments, the one or more protocols include processing a plurality of wafer lots through a first series of steps using shared equipment and tooling and identifying one or more of the wafer lots designated for copper backside. The protocols further include separating the designated copper backside wafer lots from a remainder of the wafer lots, processing the designated copper backside wafer lots through a second series of steps, such as copper plating, using dedicated equipment and tooling. The designated copper backside wafer lots can be merged with the remainder of the wafer lots after the second series of steps. In some implementations, the designated copper backside wafer lots and the remainder of the wafer lots are processed through a third series of steps using shared equipment and tooling.

In some implementations, the designated copper backside wafer lots are marked with an indicia that is different from corresponding indicia of wafer lots configured to receive a backside other than copper. The indicia can be desired lettering, such as a tag labeled COPPER. The tag may be labeled with the word "copper" in the native language of production personnel assigned to process the wafer lots. The indicia can also include a color that is different from the color of the corresponding indicia. In other implementations, the wafer designated copper backside wafer lots are placed in containers having a color that is different from the color of containers used to hold the remainder of the wafer lots. In yet other implementations, production personnel are required to wear different color gloves when handling the designated copper backside wafer lots in the second series of steps. The color of gloves worn by production personnel at the second series of steps are preferably monitored and verified in some implementations.

According to another aspect of the invention, a method of manufacturing a GaAs integrated circuit including a copper backside includes identifying a lot of GaAs wafers configured to receive a copper backside, each of the wafers is mounted on a respective carrier. The method further includes depositing a desired thickness of copper on a backside of each of the GaAs wafers, forming a scribing street by removing a portion of the copper from each of the GaAs wafers, depositing a protective layer of conductive material on the backside of the GaAs wafers, and debonding each of the GaAs wafers from the respective carrier. In some implementations, the lot of GaAs wafers configured to receive a copper backside is identified by being placed in a carrier having a color that is different from the color of carriers for GaAs wafers configured to receive a backside other than copper. In other implementations, the lot of GaAs wafers configured to receive a copper backside is identified prior to processing the wafers through a process that is susceptible to cross-contamination between copper and gold. In yet other implementations, the lot of GaAs wafers configured to receive a copper backside is identified prior to processing the wafers through a process that induces copper oxidation.

Semiconductor integrated circuits can be made in accordance with the various methods disclosed herein.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 2 shows a wafer carrier designated for both copper-contact and gold-contact GaAs wafers prior to metallization processes.

FIG. 4 shows wafer carriers having identifying labels affixed thereto.

FIGS. 9A-9D show an example sequence of singulating a GaAs integrated circuit die from a wafer.

DETAILED DESCRIPTION OF THE PREFERRED EMBODIMENT

The headings provided herein, if any, are for convenience only and do not necessarily affect the scope or meaning of the claimed invention.

Various embodiments of the present disclosure relate to novel systems and methods for utilizing the same fabrication process line to manufacture GaAs devices having different contact materials. For example, GaAs devices can be fabricated using gold as a metal contact layer. The inventors have also developed methods and systems for fabricating GaAs devices using copper as a contact material. Copper provides many advantages in GaAs integrated circuits over existing gold contact material. However, since copper has not traditionally been used in GaAs device manufacturing, its integration into existing GaAs fabrication process lines can present special problems and challenges such as cross-contamination.

Copper contamination can deleteriously affect the functionality of GaAs wafers with gold contact material. While establishing separate dedicated equipment, or even separate facilities, for copper and gold processing may avoid cross-contamination, such recourse is typically cost-prohibitive. Accordingly, the inventors have developed a novel method of integrating copper backside plating processes into the traditional gold plating GaAs fabrication line, which in some embodiments involves identifying certain equipment and/or tools that can be shared between copper and gold processing, and others that cannot be shared. Generally, the method may also involve modifying fabrication steps and establishing manufacturing protocols to reduce cross-contamination, oxidation and other challenges associated with integrating copper plating processes into existing gold fabrication lines. Particularly with respect to shared equipment, tools, and fabrication steps, proactive measures must be taken to reduce the risk of cross-contamination.

Figure 1:
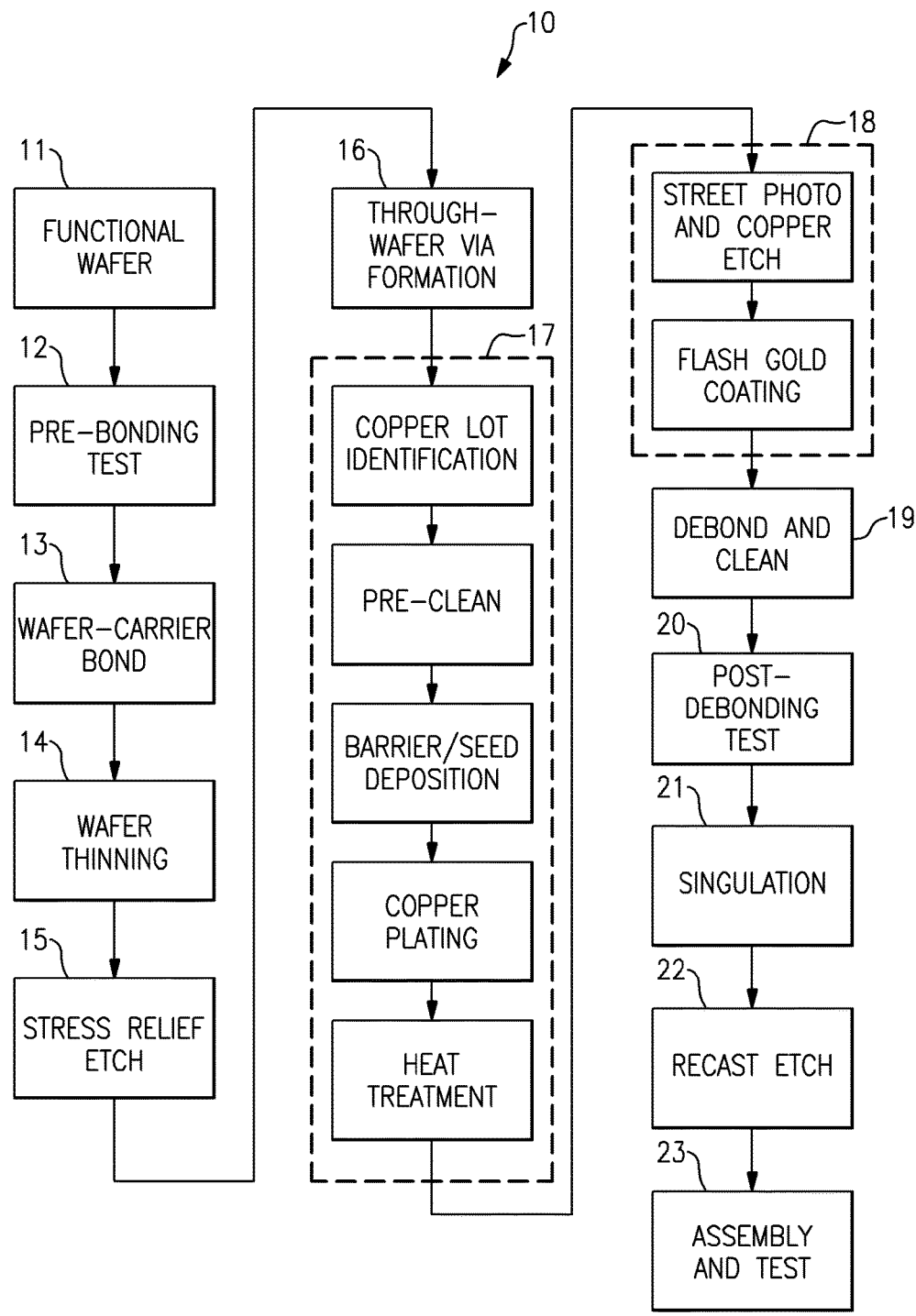
FIG. 1 is a block diagram representing an example of a sequence of wafer processing for integrating copper aspects of embodiments of the present invention into fabrication processes in GaAs integrated circuit manufacturing.

The inventors have developed process modifications and manufacturing protocols specifically designed to effectively integrated processing copper-contact GaAs circuits into existing fabrication lines for gold-contact GaAs circuits. In various embodiments of the present disclosure, GaAs wafers designated for either copper or gold contacts can be processed together in a single fabrication line with minimal risk of cross-contamination. FIG. 1 shows an example of a process 10 according to one preferred embodiment in which copper contact plating processes are integrated into an existing gold GaAs integrated circuit fabrication line so that copper-contact and gold-contact GaAs circuits can both be processed through the same fabrication line. As described in greater detail below, the process 10 incorporates various controls and protocols and is designed to allow copper-designated and gold-designated GaAs wafers to be processed together in the same fabrication line with minimal cross-contamination.

FIG. 1 will now be described in greater detail. In the process 10 of FIG. 1, a plurality of functional wafers can be provided (block 11). The functional wafers can include wafers that are designated for either gold or copper contacts. The wafers can be all placed together in a wafer rack in a manner as shown in FIG. 2 and labeled with the same lot number 5. At this stage, there is no differentiation between wafers designated for copper contact versus gold contact.

Figure 3A:
FIGS. 3A-3N show examples of structures at various stages of the processing sequence of FIG. 1.
Figure 3B:
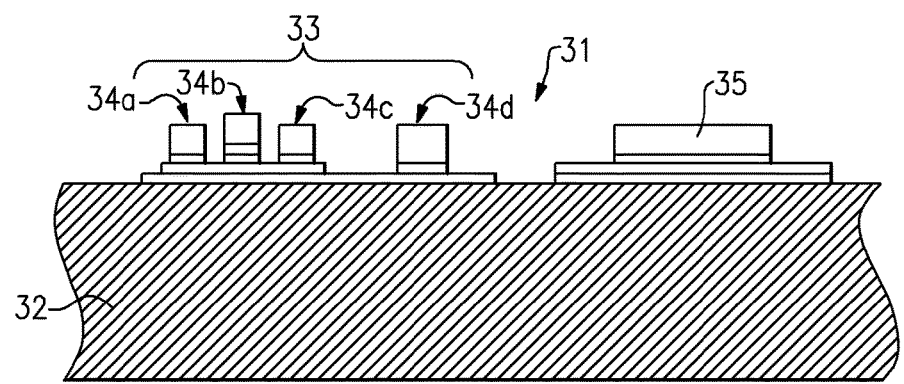

FIG. 3A depicts a side view of such a wafer 30 having first and second sides. The first side can be a front side, and the second side a back side. FIG. 3B depicts an enlarged view of a portion 31 of the wafer 30. The wafer 30 can include a GaAs substrate layer 32. The wafer 30 can further include a number of features formed on or in its front side. In the example shown, a transistor 33 and a metal pad 35 are depicted as being formed the front side. The example transistor 33 is depicted as having an emitter 34b, bases 34a, 34c, and a collector 34d. Although not shown, the circuitry can also include formed passive components such as inductors, capacitors, and source, gate and drain for incorporation of planar field effect transistors (FETs) with heterojunction bipolar transistors (HBTs). Such structures can be formed by various processes performed on epitaxial layers that have been deposited on the substrate layer.

Figure 3C:
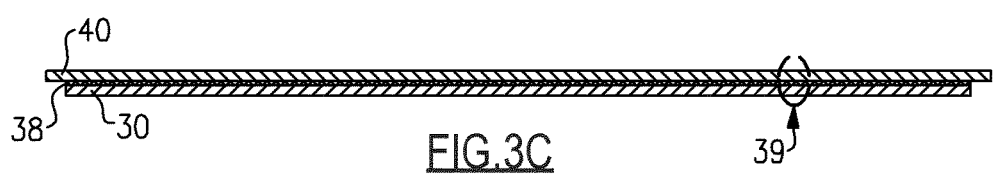

Referring to the process 10 of FIG. 1, the functional wafers of block 11 can be tested (block 12) together in a number of ways prior to bonding. Such a pre-bonding test can include, for example, DC and RF tests associated with process control parameters. Upon such testing, the wafers can be bonded to a carrier (block 13). In certain implementations, such a bonding can be achieved with the carrier above the wafer. Thus, FIG. 3C shows an example assembly of the wafer 30 and a carrier 40 (above the wafer) that can result from the bonding step 13. Referring to the process 10 of FIG. 1, the wafer—now mounted to the carrier plate—can be thinned so as to yield a desired substrate thickness in blocks 14 and 15. Up through this step (block 13), there is no differentiation between wafers designated for copper-contact versus gold-contact.

Figure 3D:
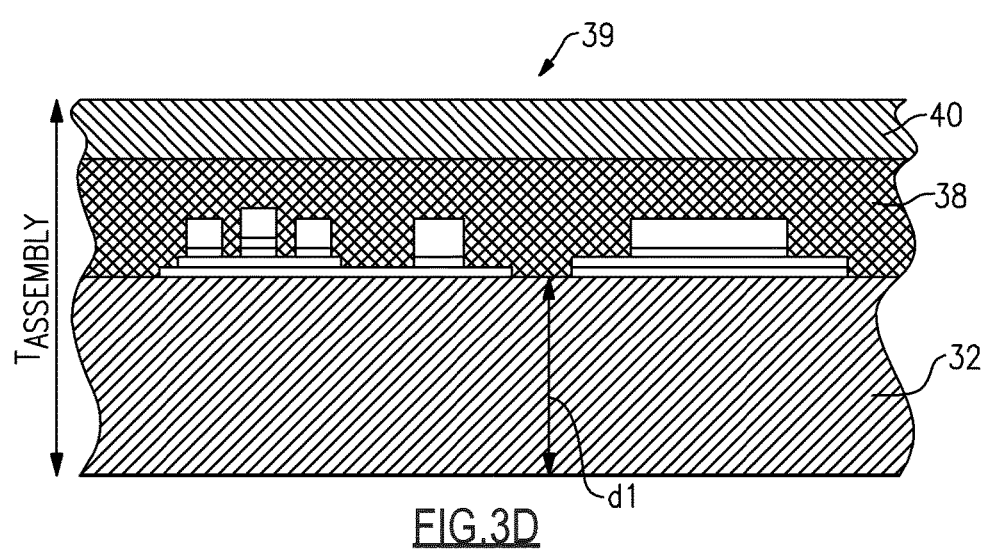
Figure 3E:
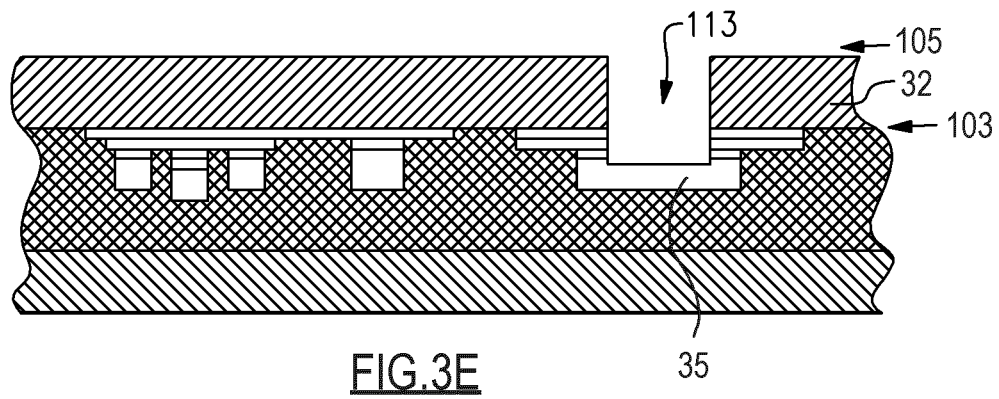

Referring to the process 10 of FIG. 1, the thinned and stress-relieved wafers can undergo a through-wafer via formation process (block 16). FIGS. 3D-3E show different stages during the formation of a via 113. Such a via is described herein as being formed from the back side of the substrate 32 and extending through the substrate 32 so as to end at the example metal pad 35. It will be understood that one or more features described herein can also be implemented for other deep features that may not necessarily extend all the way through the substrate. Moreover, other features (whether or not they extend through the wafer) can be formed for purposes other than providing a pathway to a metal feature on the front side.

Following through-wafer via formation (block 16), the GaAs wafers enter into a metallization process (block 17) in which the vias are plated and metal contacts are formed. Copper will be plated on GaAs wafers designated for copper-contact. Likewise, gold will be plated on GaAs wafers designated for gold contact. As such, the process 10 incorporates controls and protocols set in place for this stage to substantially reduce the likelihood of cross-contamination between copper and gold.

Although copper has been used successfully in silicon wafer technology, to the best of the inventors' knowledge, copper has not been successfully used in GaAs integrated circuit devices. A number of obstacles have hindered the effective use of copper in metallization of GaAs devices. For example, copper is an unintentional source of impurity, and is often proven to be the leading cause of GaAs device failures. Copper rapidly diffuses into GaAs substrates, at a rate faster than the diffusion of gold into GaAs substrates, and faster than the diffusion of copper into silicon substrates. Once copper diffuses into source/gate/drain region of a field effect transistor (FET) or active areas of a heterojunction bipolar transistor (HBT), the device will degrade, and eventually fail electrically. Unlike gold, copper can diffuse into GaAs and create deep energy levels in the GaAs band gap region. These deep levels will trap charges, which lead to degradation and failure of the GaAs devices.

To overcome the obstacles associated with effectively substituting copper for at least some of the gold in vias and back-side metal layers of GaAs integrated circuits, the inventors have developed modified processes, particularly for integrated copper through via metallization into a GaAs fabrication line which is normally configured for gold contact plating. As illustrated in FIG. 1, the metal plating of vias (block 17) is shown expanded into several sub-processes. Similarly, the street formation step (block 18) is expanded into two sub-processes. The steps associated with blocks 11-16 of FIG. 1 can be common both to wafers destined to receive a copper backside contact, and those that will later receive a gold backside contact. Accordingly, the tooling and equipment for these steps can be shared between the two different groups or lots of wafers. In some embodiments, there may be no distinction at all up through the through-wafer via formation (block 16) step of process 10. In other embodiments, the lots of wafers can be separated and designated, and yet can use shared tooling, equipment and processes through the through-wafer via formation (block 16) of the process 10.

Figure 5:
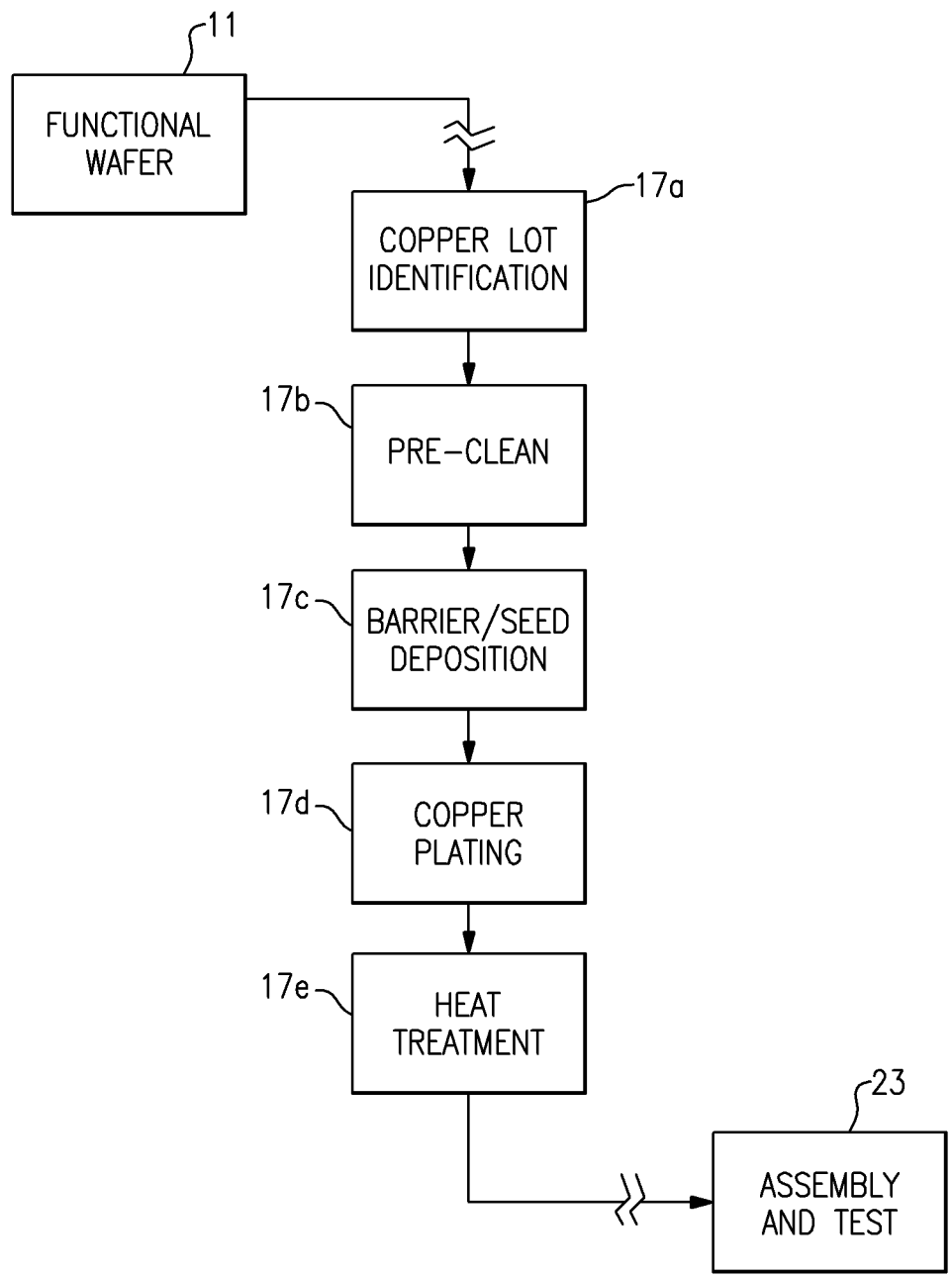
FIG. 5 is a partial block diagram of copper wafer processing directed to metal plating showing where certain protocols according to embodiments of the present invention are implemented to prevent cross-contamination.

Following the through-wafer via formation (block 16), however, the gold-contact and copper-contact wafers are separately processed for the metal plating step (block 17). FIG. 4 shows two wafer racks, each holding a plurality of GaAs wafers therein. The first wafer rack 1 is designated with the label "COPPER" while the second wafer rack 2 is designated with the label 6 reading "GOLD". Accordingly, the GaAs wafers 3 in the first wafer rack 1 are designated for processing with copper contact material. The GaAs wafers 4 in the second wafer rack 2 are designated for processing with gold contact material. With the appropriate labeling in place, separate lots of wafers are processed independently, although certain equipment and processes can be shared. As described in more detail herein, certain processing steps for copper-designated wafers deviate from those for the gold-designated wafers. In particular, processing steps between the two lots of wafers deviate to reduce the risk of cross-contamination between copper-designated and gold-designated GaAs wafers. In addition to labeling the lots separately, various other methods and procedures have been developed to reduce the risk of cross-contamination between the two lots at least partially sharing processing equipment The metallization of the backside of the wafers and through-wafer vias (block 17) can be broken down into several sub-processes. FIG. 5 shows a partial block diagram illustrating the sub-processes of the metal plating of vias (block 17).

Up through the formation of through-wafer vias (block 16), copper-contact and gold-contact wafers can be processed using shared equipment. However, to begin the metal plating of the vias (block 17), first the copper lot is identified (block 17a). For example, a conspicuous sticker or tag labeled "COPPER" may be placed on all wafer lots designated for copper plating, as shown in FIG. 4. In processing, those wafers designated for copper plating can be separated from those wafers designated for gold plating. The copper-contact wafers are then processed separately from the gold-contact wafers. The copper-contact wafers can be processed using tooling and equipment that are solely dedicated to processing of the copper-contact wafers, or in some instances the equipment may be shared, although the two groups of wafers will be processed separately.

Figure 3F:
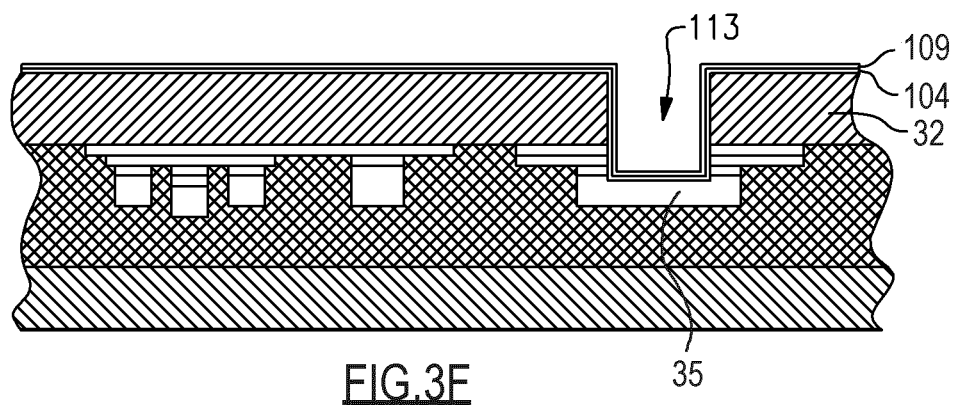

Once a wafer lot has been identified as designated for copper plating, the lot is subjected to a pre-clean step in block 17b. FIG. 3F depicts the formed via 113 processed through the pre-clean step 17b. This pre-clean step can, in various implementations, remove residues and other contamination from the via and back surface of the substrate. The pre-clean step (block 17b) can also activate the surfaces of the wafers for subsequent metal adhesion. In some embodiments, the via may be pre-cleaned (block 17b) using, for example HCl and/or an $O_2$ plasma ash process.

Figure 3G:
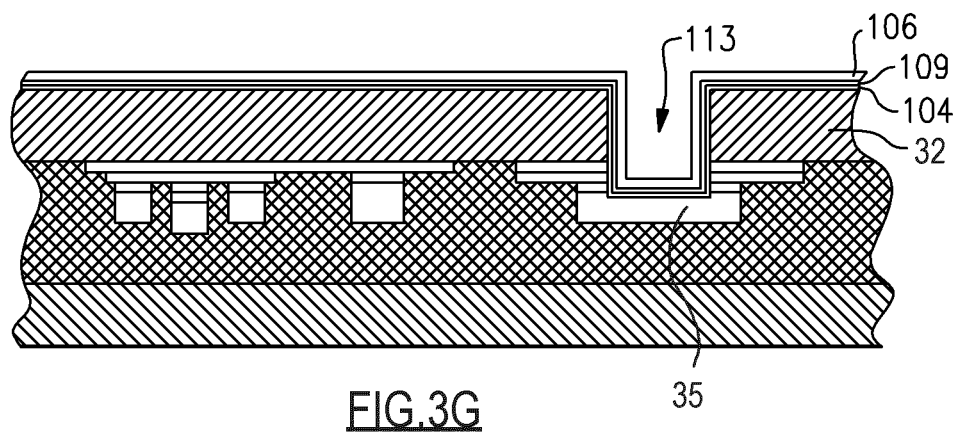
Figure 3H:
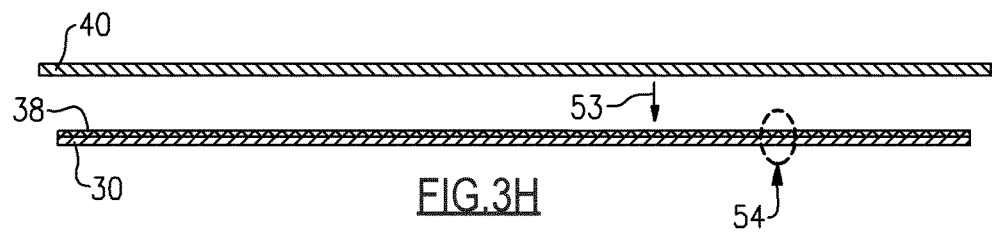
Figure 3I:
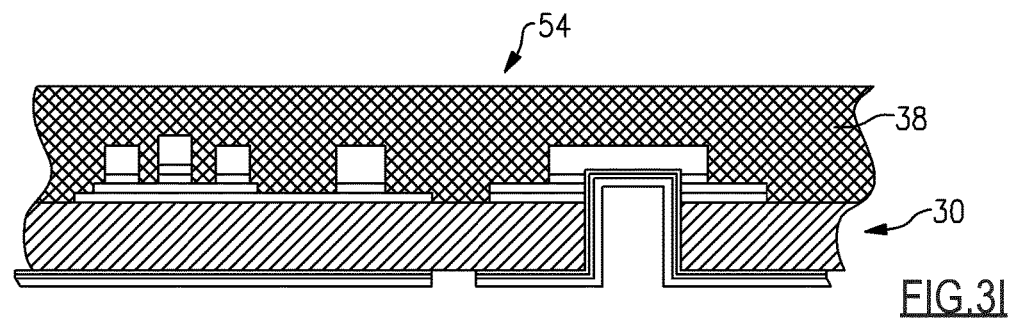
Figure 3J:
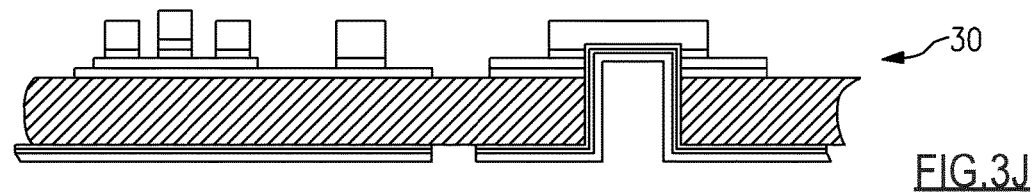
Figure 3K:
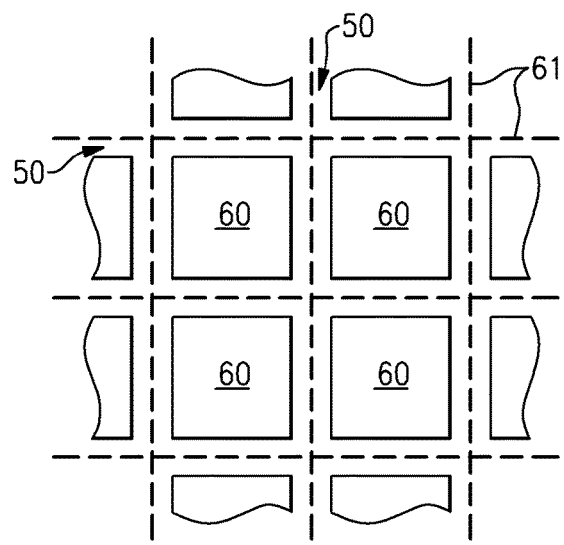
Figure 3L:
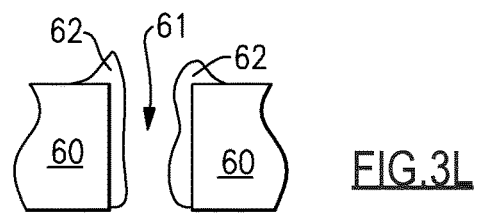
Figure 3M:
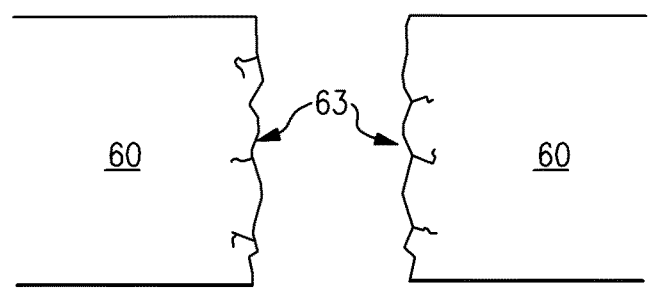
Figure 3N:
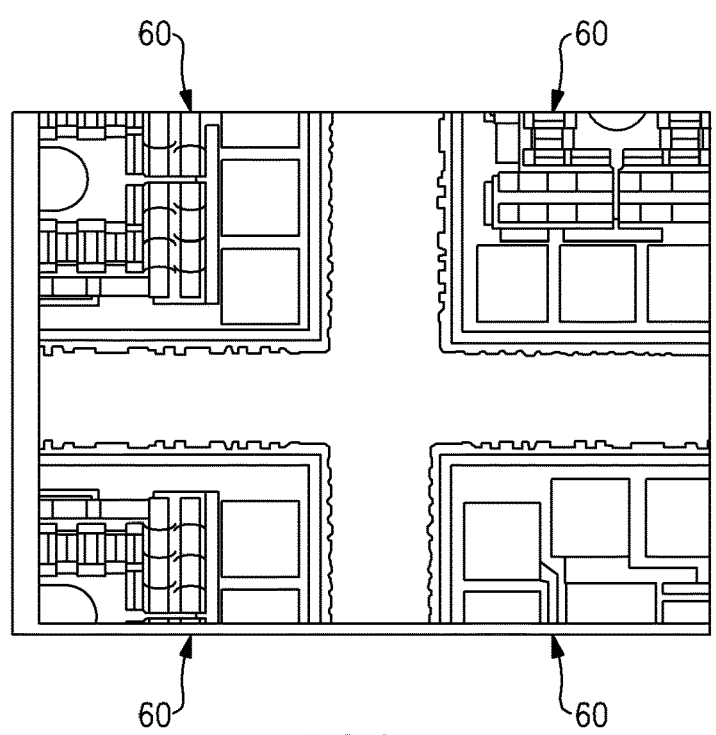

Following the pre-clean step (block 17b), the copper lot can have a metal barrier and seed layer can be subsequently deposited in the via and on the back surfaces of the substrates in block 17c. FIG. 3G shows an example of a seed layer 109 and a metal barrier layer 104 that can be formed in the via 113 and on the back surface 105 of the substrate 38. A barrier layer can first be deposited on the contact side of the GaAs substrate. In one example, the barrier layer is a nickel vanadium (NiV) layer disposed at about 800 angstroms thickness deposited using physical vapor deposition. The NiV layer provides an effective diffusion barrier between the GaAs substrate and a copper contact layer to be subsequently applied, which will be applied later. Since copper is known to have an undesirable diffusion effect on GaAs, the NiV is deposited in a relatively thick layer. It will be appreciated that the thickness of the layer may be adjusted according to the needs of the particular application. For example, devices subjected to long-term use may require thicker layers, and the layer may be adjusted according to other material used, for example, in the seed layer 109.

A seed layer may be deposited on the barrier layer. Although the seed layer may not always be necessary, it has been found that a seed layer facilitates better mechanical and electrical connection of the copper contact layer. The metal seed layer may be, for example, either a copper layer or a gold layer, and may be deposited at a thickness of about 700 angstroms using a physical vapor deposition process. If copper is used as the seed layer, then an activation process may need to be performed at a later time if the copper has been allowed to oxidize.

After the barrier/seed layer deposition (block 17c), a copper layer is formed in the via and on the back surface of the substrate in block 17d. FIG. 3G shows an example of a copper layer 106 that can be formed in the via 113 and on the back surface 105 of the substrate 38. The copper layer 106 can replace some or all of the gold contact layer that is typically deposited in the via 113 and on the back surface 105.

One typical electroplating process involves the use of a copper sulfate ($CuSO_4$) bath. Typical $CuSO_4$ based electroplating chemistry contains a small amount of chloride ions, a suppressor component such as polyethylene glycol (PEG), an accelerator component such as bis(sodiumsulfopropyl) disulfide (SPS), and in most cases a nitrogen based leveling agent such as thiourea. A competition model has been understood to explain the mechanism of via fill in semiconductor circuit fabrication. According to this model, chloride is complexed with the suppressor. Due to the long chain polymer nature of the suppressor, it is unable to diffuse rapidly into a via formed on a semiconductor wafer. The accelerator, on the other hand, is often a relatively small molecule, which can diffuse much more rapidly than the suppressor into the via. As a result, the suppressor will primarily accumulate on the surface of the semiconductor wafer, whereas the accelerator will primarily accumulate inside the via. The higher concentration of the accelerator increases the plating rate of copper deposition within the via.

On the surface of the wafer, however, the suppressor functions as a diffusion barrier to prevent copper ions from diffusing onto the surface, and consequently preventing reduction of the copper ions to copper metal. The accelerator-copper complex will gradually replace the suppressor-chloride complex on the wafer surface, such that copper will then be plated on the surface of the wafer, albeit at a rate slower than the plating inside the via. This difference in diffusion mechanism between the suppressor and accelerator complexes, combined with the competitive interaction between them, contribute to the bottom-up fill of copper metallization inside the via.

As FIG. 5 further shows, an optional heat treatment step in block 17e can follow the copper deposition process of block 17d. The copper contact layer is deposited on the seed layer, if present. The copper contact layer is preferably deposited using an electroplating process, and is deposited at a relatively uniform thickness. Depending on the size of the via, the copper contact layer may simply coat the walls, or may nearly fill the via. To facilitate faster production, a 6 μm coating of the Cu contact layer typically provides sufficient electrical conduction, while leaving a central opening in via.

Typically, the metallization process can continue for 48 hours or more. Such a long process disadvantageously extends production time GaAs integrated circuit devices. Additionally, this slow process results in copper structure with significant defects, cracks, etc caused by the slow growth. Adding heat to the process both significantly accelerates the metallization process and increase the quality and uniformity of the copper grain structure. In typical PECVD processes, the heat treatment involves application of temperatures between 200 to 300° C. These temperatures may exceed the melting point for the adhesive used to bond the wafer to the carrier. Subjecting GaAs wafers mounted onto carriers to such high temperatures may therefore disadvantageously decrease the bonding strength of the carrier and wafer. Accordingly, in certain embodiments the GaAs device is subjected to a temperature of approximately 100° C. Once the GaAs has been subjected to heat treatment, the metallization (block 17) of via 113 is complete. In some embodiments, the metallization (block 17) of via 113 is complete without heat treatment.

Referring to the process 10 of FIG. 1, the GaAs wafer having a copper contact layer 106 formed on its back side 105 can undergo a street formation process (block 18). Such a street is described herein as being formed from the back side of the wafer and extending through the copper contact layer 106 to facilitate subsequent singulation of dies. It will be understood that one or more features described herein can also be implemented for other street-like features on or near the back surface of the wafer. Moreover, other street-like features can be formed for purposes other than to facilitate the singulation process.

After etching the street into copper contact layer 106, the resist layer may be removed, using photoresist strip solvents such as NMP (N-methyl-2-pyrrolidone), applied using, for example, a batch spray tool. To remove residue of the resist material that may remain after the solvent strip process, a plasma ash (e.g., $O_2$) and/or aqueous wash process can be applied to the back side of the wafer.

Following the separate processing for the copper metallization process (block 17), copper-contact wafers may share equipment and/or processes with gold-contact wafers for subsequent processes. Particular care can be taken during these steps to prevent cross-contamination between gold-contact and copper-contact wafers. Various protocols may be followed to minimize the risk of cross-contamination during use of shared equipment and/or processes. For example, there may be copper-designated and gold-designated vacuum wands, microscopes, gloves, cassettes, etc. In this way, even if the copper-contact and gold-contact wafers are processed in a similar machine, the vacuum wands and cassettes used to transfer the wafers between equipment can be separately designated. By using designated tools (such as vacuum wands and microscopes) for copper-contact wafers separate from the equipment designated for gold-contact wafers, the risk of cross-contamination can be reduced, thereby increasing overall yield. Additionally, in some embodiments, production personnel are required to wear a different color glove when processing copper backside wafer lots. The different colored glove further reduces the risk of processing copper backside wafer lots through equipment dedicated for gold-contact.

Another potential source of cross-contamination is wafer breakage. To avoid copper contamination of gold-contact wafers, extra care may be employed when addressing broken copper-contact wafers within the fabrication facility. For example, following breakage of one or more copper-contact wafers, the wafers may be quarantined, and the scraps can be removed using copper-designated vacuum cleaners, followed by a thorough wipe down of the contaminated area.

Figure 6:
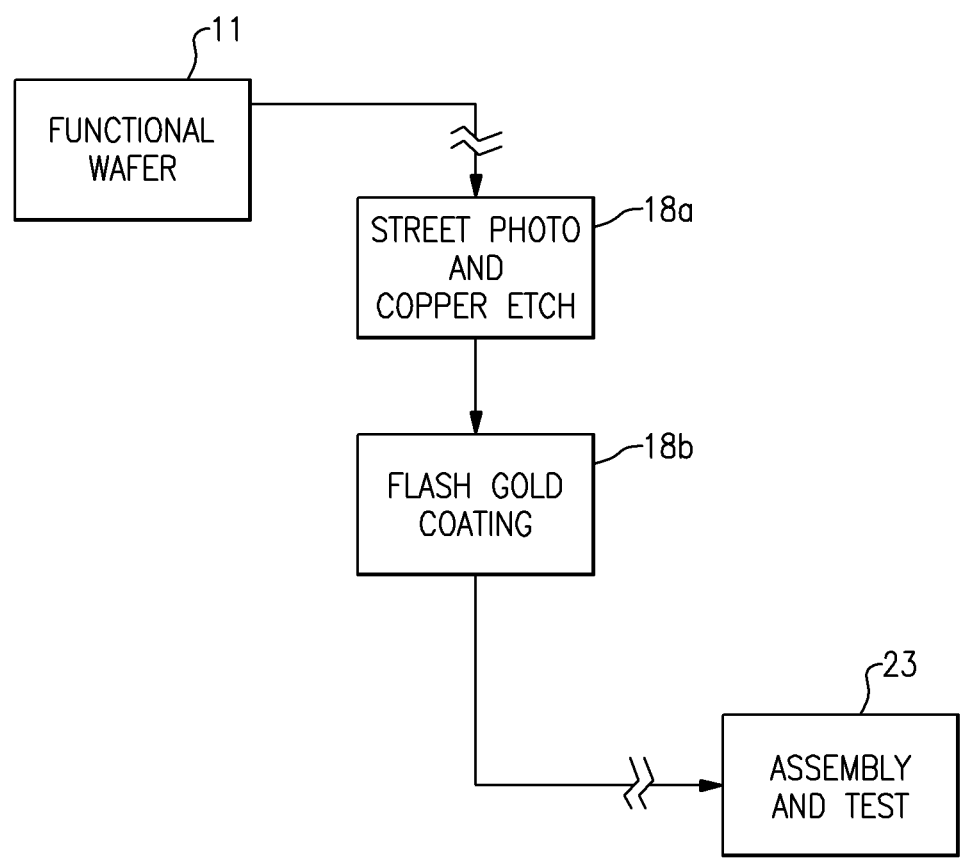
FIG. 6 is a partial block diagram of copper wafer processing directed to street formation showing where certain protocols according to embodiments of the present invention are implemented to prevent cross-contamination.

As noted above, following the metallization process (block 17), the copper-contact and gold-contact wafers may share tooling, equipment and/or processing. For example, both copper-contact and gold-contact wafers can use the same street formation equipment. FIG. 6 shows a partial block diagram illustrating the sub-processes of the street formation step (block 18). To avoid cross-contamination by the shared equipment between gold-contact and copper-contact wafers, the lots are processed separately. As noted above, copper-designated lots can be labeled, for example with a "COPPER" sticker so as to alert handlers within the fabrication facility.

In block 18a, a street is defined via photoresist, followed by a copper etch. To form an etch resist layer that defines an etching opening, photolithography can be utilized. Coating of a resist material on the back surface of the substrate, exposure of a mask pattern, and developing of the exposed resist coat can be achieved in known manners. While the photoresist and patterning portions can use shared equipment between gold-contact and copper-contact wafers, the etching process which forms the streets often involves the use of a dedicated wet bench for copper-contact wafers. The street can be formed through the copper using techniques such as wet etching (with chemistry such as potassium iodide). A pre-etching cleaning process (e.g., $O_2$ plasma ash) can be performed prior to the etching process, if desired. Once the street has been formed, the resist can be removed using strip solvents such as NMP (N-methyl-2-pyrrolidone) which can be applied using, for example, a batch spray tool. To remove residue of the resist material that may remain after the solvent strip process, a plasma ash (e.g., $O_2$) process can be applied to the back side of the wafer.

The process continues with flash gold coating (block 18b) applied to the wafer. This coating can be accomplished using shared equipment, for example a gold physical vapor deposition machine. As noted above, copper is known to oxidize readily, thereby diminishing its desirable electrical and mechanical properties. To protect against oxidation, a layer of gold is deposited through flash coating. In alternative embodiments, the flash coating can include NiV. Following the flash gold coating (block 18b), the process 10 continues as illustrated in FIG. 4.

Figure 7:
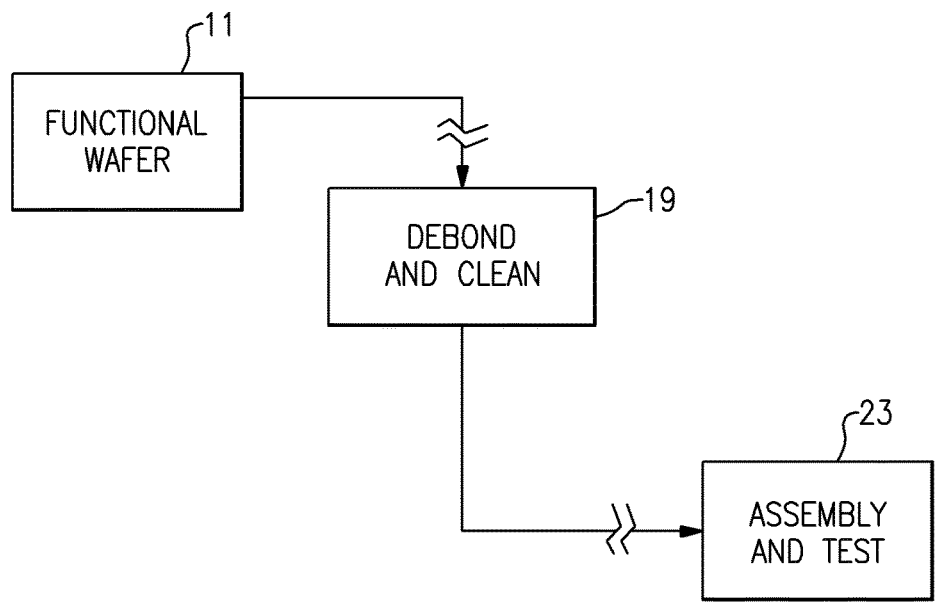
FIG. 7 is a partial block diagram of copper wafer processing directed to carrier debonding showing where certain protocols according to embodiments of the present invention are implemented to prevent cross contamination.

FIG. 7 shows a partial block diagram illustrating the debond and clean step (block 19). Following street formation, resist removal, and flash gold coating, the wafer no longer needs to be mounted to a carrier plate. Thus, the wafer is debonded or separated from the carrier plate in block 19. In certain implementations, separation of the wafer from the carrier plate can be performed with the wafer below the carrier plate. Any adhesive remaining on the front side of the wafer can be removed by a cleaning solution (e.g., acetone), and remaining residues can be further removed by, for example, a plasma ash (e.g., $O_2$) process.

Figure 8:
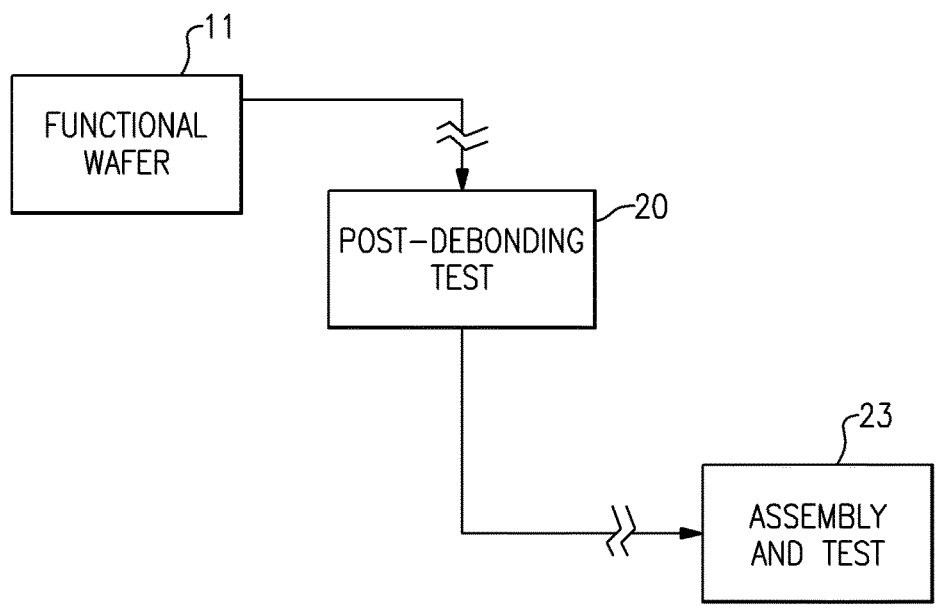
FIG. 8 is a partial block diagram of copper wafer processing directed to testing showing where certain protocols according to embodiments of the present invention are implemented to prevent cross contamination.

FIG. 8 shows a partial block diagram illustrating the post-debonding test step (block 20). The debonded wafer of block 19 can be tested (block 20) in a number of ways prior to singulation. Such a post-debonding test can include, for example, resistance of the metal interconnect formed on the through-wafer via using process control parameters on the front side of the wafer. Other tests can address quality control associated with various processes, such as quality of the through-wafer via etch, seed layer deposition, and metal plating.

Throughout the shared equipment and processes associated with the street formation by copper etch (block 18a), flash gold coating (block 18b), debond and cleaning (block 19), and post-debonding testing (block 20), various protocols can be employed to reduce the risk of cross-contamination between copper-contact wafers and gold-contact wafers. As noted above, one such protocol involves separating wafer lots and labeling copper-contact lots with a clearly-marked "COPPER" sticker. The copper-contact lots can therefore be handled using separate cassettes, gloves, vacuum wands, and other tools. These steps can allow one fabrication line to share processing steps and equipment for gold-contact and copper-contact wafers, while reducing the risk of cross-contamination between them.

Integrated Circuit Singulation and Packaging

FIG. 9A illustrates a GaAs wafer 200 with a plurality of individual integrated circuits 201 formed in accordance with embodiments of the invention in which copper is used as a contact metal for the vias and back-side plane. As shown in FIG. 9A, streets 202 have been formed in the regions between each integrated circuit 201 on the wafer 200. As described above, street formation involves removing copper in the regions between the integrated circuits.

Following street formation, the wafer 200 is placed onto cutting tape 203, with the backside of the GaAs wafer 200 adhering to the cutting tape 203 and frame in the manner shown in FIGS. 9B and 9C. Next, the integrated circuit dies are singulated by cutting through the GaAs wafer along the pre-formed streets. A scribe may be applied to the streets in order to mechanically singulate the integrated circuit dies. Alternatively, a laser may be used to burn through the streets. Mechanical scribing is inexpensive, but typically less accurate than laser singulation, and may cause damage to the die. Laser singulation is more accurate and reduces damage, but at increased expense.

Once the integrated circuit dies have been singulated, the cutting tape is stretched apart. This stretching ensures that the dies have been singulated, as it results in widening the separation between each of the dies. The cutting tape may be stretched until the tape is visible between each of the dies. FIG. 9C illustrates stretched cutting tape in which some of the singulated dies have been removed. The dies may be removed from the cutting tape manually or by automated robotics. For example, an automated die-picking machine may select and remove individual dies through the use of vacuum pressure. FIG. 9D illustrates a singulated GaAs integrated circuit die, according to an embodiment of the present invention.

Once individual GaAs integrated circuit dies have been formed, they may be packaged for incorporation into larger electronic devices. Various types of packaging exist, some of which are described in more detail below. It will be understood that there exist myriad different types of packaging beyond those listed and described herein. Depending on the desired application, virtually any type of packaging may be used in accordance with the present invention. Four different packages are described in more detail below: ball grid array (BGA), land grid array (LGA), molded leadframe, and quad-flat no-leads (QFN).

Figure 10:
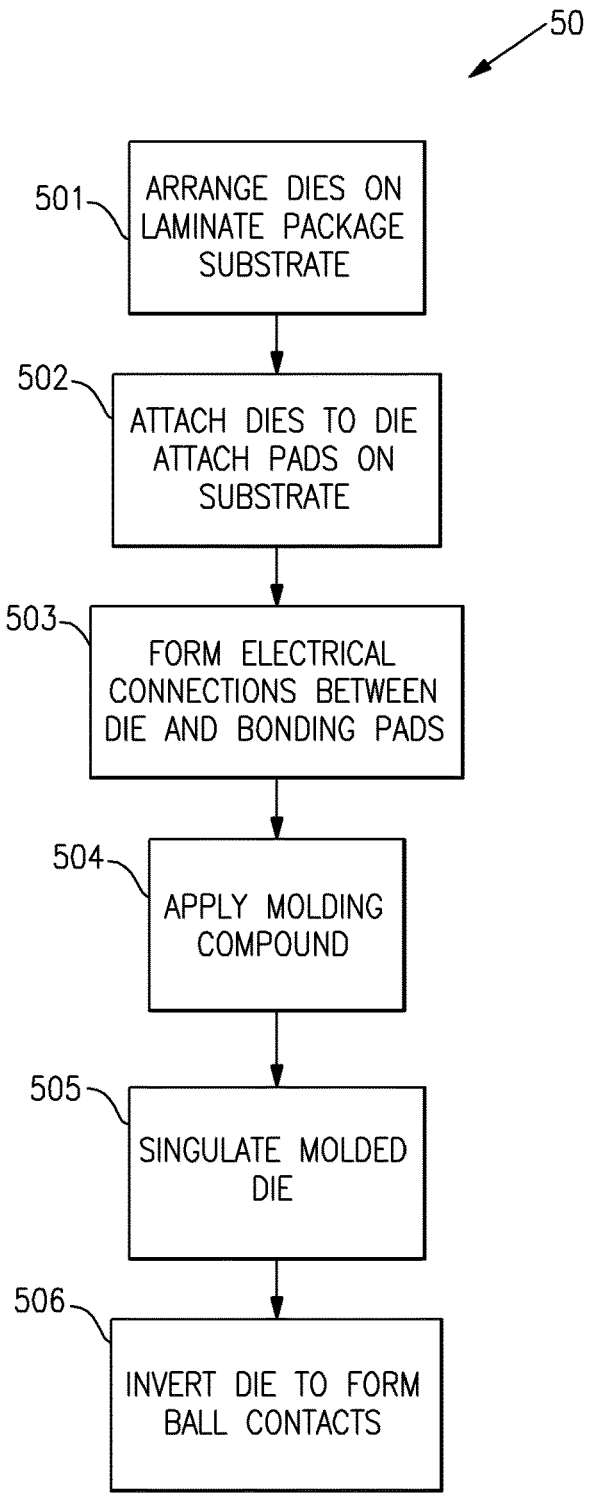
FIG. 10 shows an example sequence of ball grid array packaging of singulated GaAs integrated circuit dies, according to one embodiment.
Figure 11A:
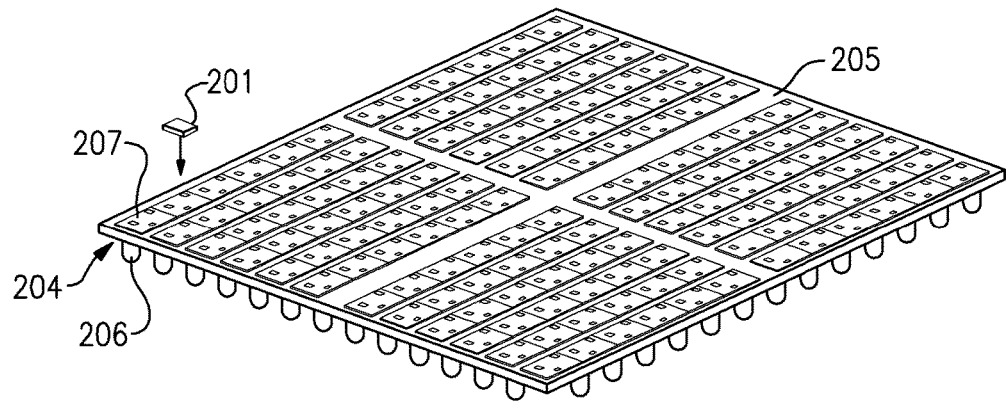
FIGS. 11A-11H show examples of structures at various stages of the processing sequence of FIG. 10.

FIG. 10 shows an example shows an example sequence of BGA packaging of singulated GaAs integrated circuit dies, according to one embodiment, with FIGS. 11A-11H showing examples of structures at various stages of the processing sequence of FIG. 10. With reference to FIG. 11A, individual dies 201 are arranged (block 501), typically in an array, onto a laminate packaging substrate 205. A single packaging substrate 205 such as that shown in FIG. 11A can include between 200 to 400 dies 201, although the specific number may vary depending on the application. The packaging substrate 205 includes pre-formed lower contact pads 204 on its lower surface. As described in more detail below, a grid of solder balls 206 are formed on the lower contact pads 204. On the top surface the packaging substrate has die attach pads 207, onto which singulated dies 201 are mounted, and a plurality upper contact pads 208. The packaging substrate includes internal interconnections to electrically connect the upper contact pads 208 on the top surface to the lower contact pads 204 on the bottom surface.

Figure 11B:
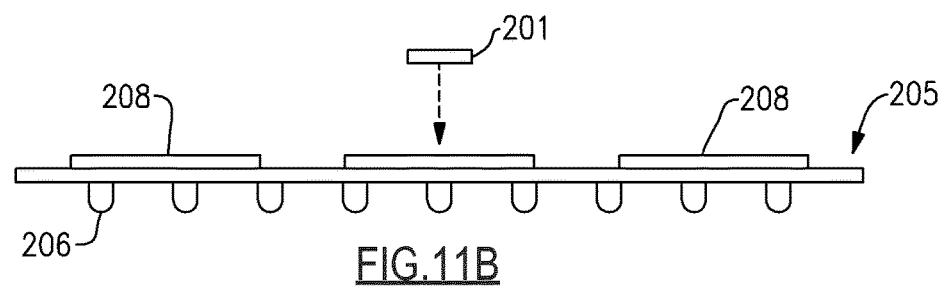
Figure 11C:
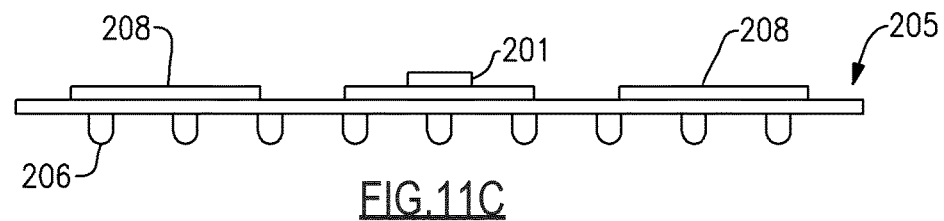

The die attach pad 207 is typically flat and made of tin-lead, silver, or gold-plated copper. With reference to FIGS. 11B and 11C, the individual dies 201 are attached to the die attach pads 207 (block 502) by applying solder paste to all die attach pads 207. Solder paste is an adhesive mixture of flux and tiny solder particles. The solder paste may be deposited by the use of a screen printing process, or by jet-printing. After the solder paste has been applied, individual dies are placed onto the packaging substrate 205 by robotic pick-and-place machines. Individual dies 201 may be removed from the cutting tape and transferred directly to the packaging substrate, where they are positioned to align the die attach pads with the contacts of the individual dies. The solder paste connects the die attach pads 207 to the contacts of the individual dies 201. To provide a more robust connection, the dies are subjected to heat treatment for solder reflow. The precise temperatures and times for this process will vary depending on the composition of the solder paste. Typical temperatures range from 100° to 260° C., with dwell times at peak temperatures ranging from 50 seconds to two minutes. This heat treatment causes the solder particles within the solder paste to melt. The solder is then allowed to cool, resulting in a robust electrical and mechanical connection between the packaging substrate and the individual dies.

Figure 11D:
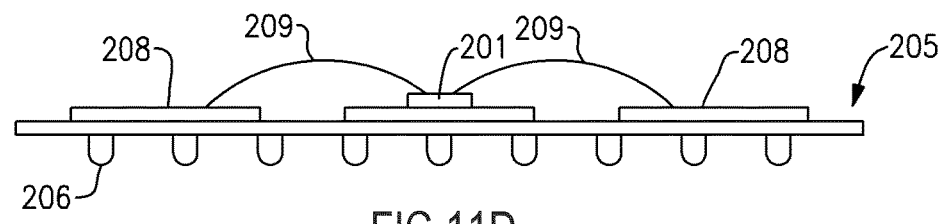

With reference to FIG. 11D, following attachment of the individual dies 201 to the packaging substrate 205, electrical interconnection is formed between bonding pads on the integrated circuit and the upper contact pads 208 on the top surface of the packaging substrate 205 (block 503). This connection may be formed by wire bonding or flip-chip methods. Wire bonding involves arranging wires 209, often made of copper, gold, or aluminum, between an upper contact pad 208 at one end, and a bonding pad on the integrated circuit die 201 at the other. The wire 209 is attached using some combination of heat, pressure, and ultrasonic energy to weld the wire 209 in place. Flip chip interconnection involves applying solder bumps to the bonding pads on the top surface of the integrated circuit. The integrated circuit is then inverted, and arranged such that the solder bumps align with contact pads. With the application of heat, the solder bumps melt and, following a cooling process, an electrical and mechanical connection may be formed between the bonding pads on the integrated circuit die and the contact pads on the packaging substrate.

Figure 11E:
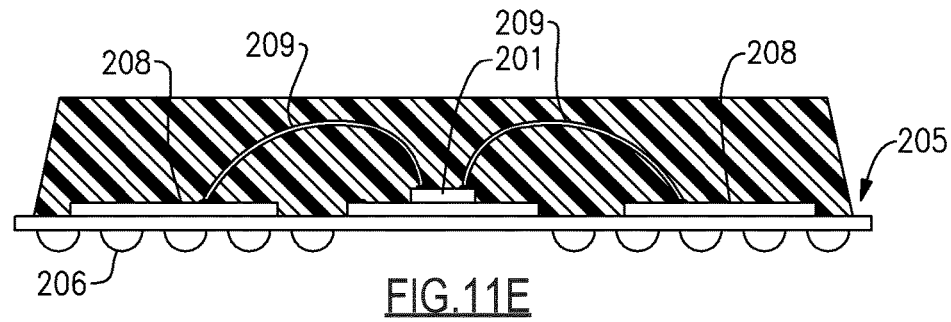
Figure 11F:
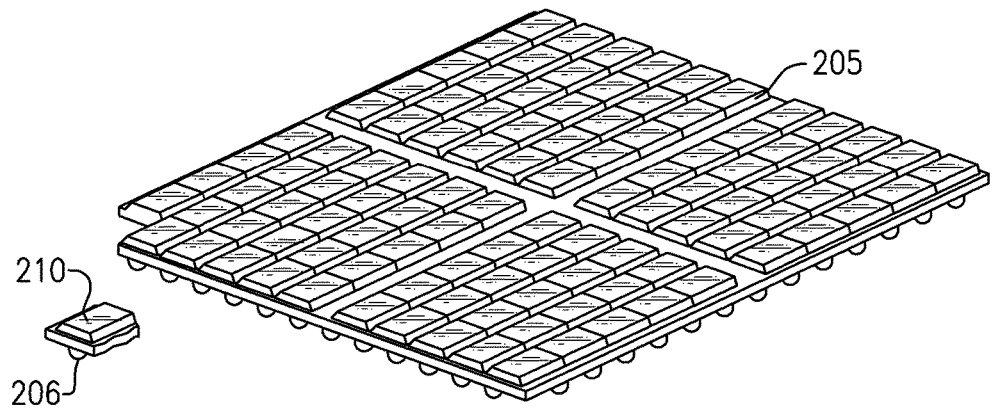

With reference to FIG. 11E, after electrical interconnection has been formed between the die and the packaging substrate, the entire packaging substrate is covered with a molding compound 210 (block 504). There are a wide variety of commercially available molding compounds. Typically, these are epoxy-based compounds. The packaging substrate 205 covered with the molding compound 210 is then cured in an oven. The temperature and duration of curing depends on the particular molding compound selected. As shown in FIG. 11F, after the molding compound 210 has cured, the each die 201 on the packaging substrate 210 is totally encapsulated, including the electrical interconnections 209, with only the bottom surface of the packaging substrate 205, with its lower contact pads, exposed. At this stage, the packaging substrate 205 covered with cured molding compound 210 can be sawed (block 505), thereby singulating the packaged devices. Singulation may be performed mechanically, such as with a wafer saw.

Figure 11G:
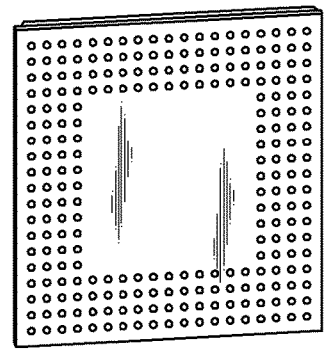
Figure 11H:
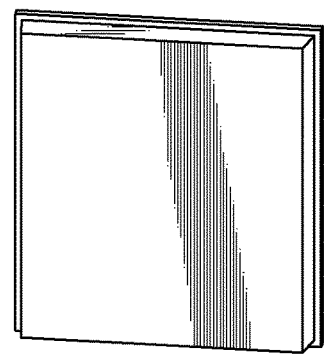

Each packaged device is inverted at this stage, and then on top of each lower contact pad 204 on the packaging substrate, a small ball of solder paste is deposited, creating a grid of solder paste balls 206 (block 506). The BGA package may then be placed over solder pads on a PCB, with each solder paste ball 206 aligned to a solder pad. The solder pads are flat, and typically made of tin-lead, silver, or gold-plated copper. FIG. 11E illustrates a schematic cross-section of a singulated BGA packaged die, with FIGS. 11G and 11 illustrating the top and bottom perspective views of the same.

Mounted Integrated Circuit Device

Figure 12:
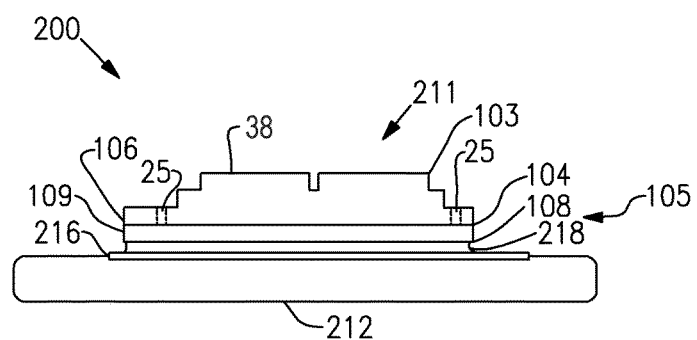
FIG. 12 illustrates a GaAs integrated circuit device made according to various methods of the present invention, mounted onto a printed circuit board.

FIG. 12 illustrates one embodiment of a GaAs integrated circuit device 200. The device 200 generally comprises a printed circuit board 212 connected to a GaAs integrated circuit 211. The GaAs integrated circuit 211 has a backside 105 and a frontside 103. The GaAs integrated circuit 211 includes a GaAs substrate 38, a barrier layer 104, a protective layer 108, and a copper contact layer 106. In some embodiments, the GaAs integrated circuit 211 may also include a seed layer 109 between the copper contact layer 106 and the barrier 104. The seed layer 109 may serve to facilitate mechanical and electrical connection to the copper contact layer 106, but is not always necessary. The printed circuit board includes a pad which is adapted to couple with the GaAs integrated circuit 211 at the backside 105. The GaAs integrated circuit 211 is configured to be mounted on the printed circuit board 212 by the pad 216. In one embodiment, the GaAs integrated circuit 211 is mounted to the pad 216 by a layer of solder 218 interposed between the backside 105 and the pad 216.

The barrier layer 104 is formed on the lower surface 105 of the GaAs substrate 38 and serves to isolate the copper contact layer 106 from the GaAs substrate 38 to prevent copper diffusion. The copper contact layer 106 is formed on the backside 105 of the GaAs integrated circuit 211. The copper contact layer 106 provides an electrical ground contact between the GaAs substrate 38 and the pad 216 on the printed circuit board 212. In one embodiment, the layer of solder 218 is formed between the copper contact layer 106 and the pad 216 to securely mechanically attach the backside 105 of the GaAs integrated circuit 211 to the printed circuit board 212. In one embodiment, the protective layer 108 is formed between the copper contact layer 106 and the solder 218 to prevent oxidation of the copper. The GaAs substrate 38 comprises a plurality of vias 25 which have been etched through the GaAs substrate 38 to form electrical connections between various integrated circuits disposed thereon. The vias 25 have sidewalls which will comprise the layers previously deposited on the GaAs substrate, as described in more detail above.

Figure 13:
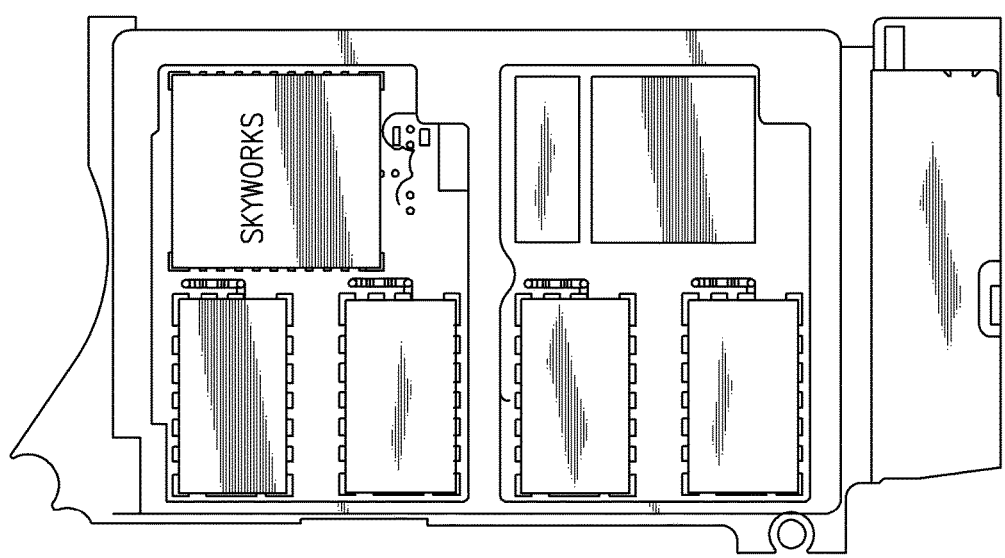
FIG. 13 illustrates an electronic device incorporating a GaAs integrated circuit device made according to various methods of the present invention.

FIG. 13 illustrates a portion of an electronic device incorporating a GaAs integrated circuit device made according to various methods of the present invention. In some embodiments, the device can be a portable wireless device, such as a cellular phone. The device can include a battery configured to supply power to the device, a circuit board configured to provide support for and to interconnect various electronic components, and an antenna configured to receive and transmit wireless signals. The electronic device can include a number of additional components, such as a display processor, central processor, user interface processor, memory, etc. In other embodiments, the electronic device may be a component of a tablet computer, PDA, or other wireless device.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of utilizing a single GaAs integrated circuit manufacturing process line to produce integrated circuits from wafer lots with backside conductive material selected from at least a first backside material and a second backside material, said method comprising:
   identifying one or more of said wafer lots designated for said second backside material by marking said wafer lots with indicia indicating said second backside material is associated therewith;
   performing pre-bond testing, wafer-carrier bonding, wafer thinning, stress relief etching, and through-wafer formation on a plurality of said wafer lots having the first backside material and a plurality of said wafer lots having the second backside material using shared equipment and tooling;
   removing the plurality of wafer lots having the second backside material and performing pre-cleaning, barrier and seed layer deposition, metal plating, and heat treatment on the plurality of wafer lots having the second backside material using dedicated equipment and tooling; and
   performing street formation, copper etching, flash gold coating, debonding and cleaning on the plurality of wafer lots having the first backside material and the plurality of wafer lots having the second backside material using shared equipment and tooling.

2. The method of claim 1 wherein said first backside material is gold.

3. The method of claim 2 wherein said second backside material is copper.

4. The method of claim 3 wherein said identifying includes identifying one or more of said wafer lots designated for copper backside.

5. The method of claim 4 wherein identifying one or more of said wafer lots designated for copper backside includes marking said wafer lots with indicia indicating copper is associated therewith.

6. The method of claim 5 wherein said indicia includes a tag labeled with desired lettering.

7. The method of claim 6 wherein said desired lettering includes the word copper in a native language of production personnel assigned to process said wafer lots.

8. The method of claim 4 wherein identifying said one or more wafer lots includes placing said one or more wafer lots in containers having a color that is different from the color of containers used to hold the plurality of wafer lots having the first backside material.

9. The method of claim 4 wherein said one or more protocols includes requiring production personnel to wear different color gloves when handling the plurality of wafer lots having the first backside material and the plurality of wafer lots having the second backside material.

10. The method of claim 9 wherein said one or more protocols includes monitoring and verifying the color of gloves worn by production personnel.

11. The method of claim 4 wherein said dedicated equipment and tooling includes plating equipment and wafer carriers.

12. The method of claim 1 further comprising identifying GaAs manufacturing steps that may cause cross contamination between gold and copper.

13. A method of utilizing a single GaAs integrated circuit manufacturing process line to produce integrated circuits with backside conductive material selected from at least two materials, said method comprising:

- separately marking gold-contact wafers having gold backside conductive material and copper-contact wafers having copper backside conductive material;
- performing pre-bond testing, wafer-carrier bonding, wafer thinning, stress relief etching, and through-wafer formation on a plurality of wafer lots having the gold backside conductive and a plurality of wafer lots having the copper backside conductive material using shared equipment and tooling;
- removing the plurality of wafer lots having the copper backside conductive material and performing pre-cleaning, barrier and seed layer deposition, metal plating, and heat treatment on the plurality of wafer lots having the copper backside conductive material using dedicated equipment and tooling; and
- performing street formation, copper etching, flash gold coating, debonding and cleaning on the plurality of wafer lots having the gold backside conductive material and the plurality of wafer lots having the copper backside conductive material using shared equipment and tooling.

14. The method of claim 13 wherein said metal plating includes copper plating.

15. The method of claim 13 wherein said dedicated equipment and tooling includes plating equipment and wafer carriers.

16. The method of claim 13 further including monitoring and verifying a color of gloves worn by production personnel.

17. A method of utilizing a single GaAs integrated circuit manufacturing process line to produce integrated circuits with backside conductive material selected from at least two materials, said method comprising:

- separately marking gold-contact wafers having gold backside conductive material as gold-marked wafers and copper-contact wafers having copper backside conductive material as copper-marked wafers;
- performing pre-bond testing, wafer-carrier bonding, wafer thinning, stress relief etching, and through-wafer formation on a plurality of wafer lots having the gold backside conductive and a plurality of wafer lots having the copper backside conductive material using shared equipment and tooling;
- removing the plurality of wafer lots having the copper backside conductive material and performing pre-cleaning, barrier and seed layer deposition, metal plating, and heat treatment on the plurality of wafer lots having the copper backside conductive material using dedicated equipment and tooling; and
- performing street formation, copper etching, flash gold coating, debonding and cleaning on the plurality of wafer lots having the gold backside conductive material and the plurality of wafer lots having the copper backside conductive material using shared equipment and tooling, said copper-marked wafers and said gold-marked wafers being separated into containers having different colors and production personnel wear different gloves when handling said copper-marked wafers and said gold-marked wafers.

18. The method of claim 17 further including monitoring and verifying a color of gloves worn by production personnel.

19. The method of claim 17 wherein said metal plating includes copper plating.

20. The method of claim 17 wherein said dedicated equipment and tooling includes plating equipment and wafer carriers.

* * * * *